(12) United States Patent
Chiu et al.

(10) Patent No.: US 10,061,272 B2
(45) Date of Patent: Aug. 28, 2018

(54) PIPELINED SAR ADC USING COMPARATOR AS A VOLTAGE-TO-TIME CONVERTER WITH MULTI-BIT SECOND STAGE

(71) Applicant: BOARD OF REGENTS, THE UNIVERSITY OF TEXAS SYSTEM, Austin, TX (US)

(72) Inventors: Yun Chiu, Frisco, TX (US); Benwei Xu, San Diego, CA (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 0 days.

(21) Appl. No.: 15/620,821

(22) Filed: Jun. 12, 2017

(65) Prior Publication Data

US 2017/0357219 A1    Dec. 14, 2017

Related U.S. Application Data

(60) Provisional application No. 62/348,990, filed on Jun. 12, 2016.

(51) Int. Cl.
*H03M 1/06* (2006.01)
*G04F 10/00* (2006.01)
*H03M 1/38* (2006.01)
*H03M 1/12* (2006.01)
*H03M 1/00* (2006.01)

(52) U.S. Cl.
CPC ........ *G04F 10/005* (2013.01); *H03M 1/1245* (2013.01); *H03M 1/38* (2013.01); *H03M 1/00* (2013.01); *H03M 1/0695* (2013.01); *H03M 1/12* (2013.01)

(58) Field of Classification Search
CPC ......... H03M 1/0695; H03M 1/00; H03M 1/12
USPC .......................... 341/161, 155, 120, 156, 122
See application file for complete search history.

(56) References Cited

U.S. PATENT DOCUMENTS 9,673,835 B1 *   6/2017   Kinyua ................. H03M 1/468

* cited by examiner

*Primary Examiner* — Joseph Lauture
(74) *Attorney, Agent, or Firm* — Talem IP Law, LLP

(57) ABSTRACT

A two-stage successive-approximation-register (SAR) analog-to-digital converter (ADC) comprising is described. The SAR ADC includes a first stage comprising a SAR ADC; a voltage-to-time interface that translates a voltage-domain residue from the SAR ADC to a time-domain residue; and a second stage comprising a time-to-digital converter (TDC) that resolves multiple bits from the time-domain residue.

11 Claims, 15 Drawing Sheets

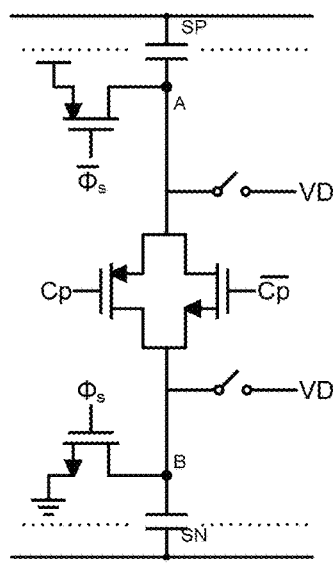 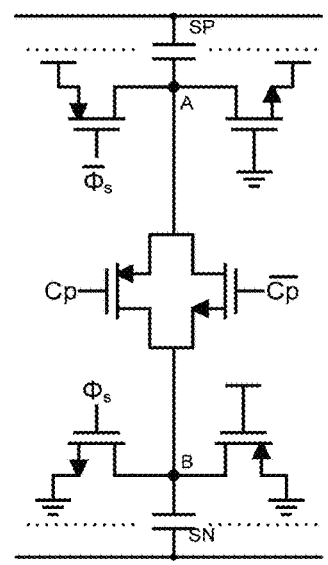
Figure 11A              Figure 11B
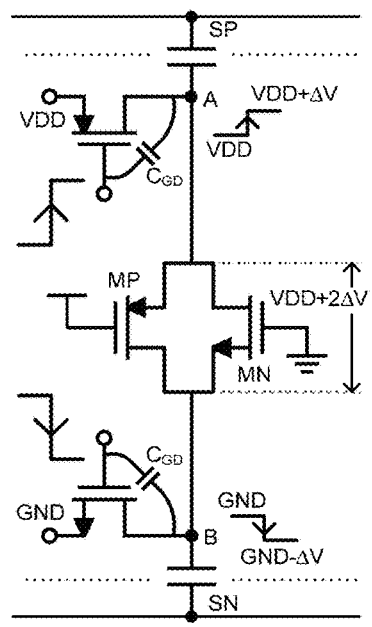
Figure 11C

PIPELINED SAR ADC USING COMPARATOR AS A VOLTAGE-TO-TIME CONVERTER WITH MULTI-BIT SECOND STAGE

CROSS-REFERENCE TO RELATED APPLICATION

The present application claims the benefit of U.S. Provisional Application Ser. No. 62/348,990, filed Jun. 12, 2016, which is hereby incorporated by reference in its entirety, including any figures, tables, and drawings.

BACKGROUND

Data traffic growth in global networks demand higher I/O data rates. Analog-to-digital (ADC) converters are being incorporated into high-speed backplane receivers and even coherent fiber-optic receivers to achieve greater throughput of data.

High-speed communication links are necessary between computers to facilitate movement of bits from one computer to another. For example, within a "data farm," thousands of servers communicate with each other through optical or electrical pathways. These pathways are referred to as high-speed networks, communicating at speeds in the range of hundreds of gigabits/second (Gb/s) or faster. To facilitate the transport of digital bits between the servers in the network, transceivers (built from integrated circuits) within the servers must be very small, power efficient, and operate at very high speeds. The information coming into the transceiver, for example, from an optical fiber or a backplane link, are physical voltages or currents. These voltages or currents are in analog form. Therefore, ADCs are used at the front end of the transceiver to receive the analog information and convert the information into digital bits that computers can understand and use for further processing.

Power density in these large data farms is an ever-increasing problem. Thousands, even millions, of servers and other equipment operate at the same time. In some cases, a dedicated power plant is required to support the power needs within in a single data farm. There is a strong motivation to design power-efficient computer chips and networking chips. Because the ADC consumes a large amount of a transceiver's power, lowering the ADC power consumption while maintaining a small footprint is very advantageous.

SUMMARY

A voltage-time hybrid successive-approximation-register (SAR) analog-to-digital converter (ADC) is described herein. The voltage-time hybrid SAR ADC can be considered a two-stage SAR ADC, where the first stage is a SAR ADC and the second stage is a time-to-digital converter (TDC) that quantizes a time difference between two output signals of the first stage to resolve multiple bits. A voltage-to-time interface connects the two stages to translate a voltage-domain residue from the first stage to a time domain residue for the second stage that can be digitized and resolved into multiple bits by the TDC. A residue production technique is performed by the voltage-to-time interface to exploit the resolving time dependence of a voltage-domain SAR comparator and achieve multibit second-stage quantization in the time domain. The voltage-to-time interface can include a comparator that can be shared with the SAR ADC.

Advantageously, by employing the TDC to digitize the resolving time of the SAR comparator, multibit information can be obtained without resorting to a conventional voltage-domain residue amplifier and a second ADC.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DESCRIPTION OF THE DRAWINGS

FIGS. 11A-11C illustrate DAC driver implementations. FIG. 11A shows an example of a DAC driver with additional common-mode switches; FIG. 11B shows an example of dummy switches added to node A and node B; FIG. 11C shows that a voltage across the crowbar switches in $C_{DAC}$ is larger than VDD.

FIG. 22A shows a plot of the simulated voltage-to-time transfer curve; and FIG. 22B shows the measured LUT content.

DETAILED DESCRIPTION

A voltage-time hybrid successive-approximation-register (SAR) analog-to-digital converter (ADC) is described herein. The voltage-time hybrid SAR ADC can be referred to as a two-stage SAR ADC, where the first stage is a SAR ADC and the second stage is a time-to-digital converter (TDC) that quantizes a time difference between two output signals of the first stage to resolve multiple bits. A voltage-to-time interface connects the two stages and includes a comparator that can be shared with the SAR ADC.

Advantageously, by employing the TDC to digitize the resolving time of the SAR comparator, multibit information can be obtained without resorting to a conventional voltage-domain residue amplifier and a second ADC.

The voltage-time hybrid SAR works as a normal SAR ADC for the first N1 bits (generally taking one clock cycle per bit). After the first N1 bit cycles of the first stage, the residue voltage on the summing nodes, or comparator input nodes, forms an N1-bit quantization noise of the input. An extra comparison is then performed, at a next clock cycle, on this voltage-domain residue for voltage-to-time conversion of the residue. That is, the voltage-to-time interface can perform a comparison similar to that of the previous N1 comparisons, but the signal is passed to a TDC, which quantizes the resolving time of the comparator into N2 bits.

The overall ADC resolution in the ideal case is therefore N1+N2 bits. As can be seen, all of the second-stage resolution can be achieved without a voltage-domain residue amplifier.

Thus, power efficiency and reduced footprint can be achieved by using the two-stage voltage-time hybrid SAR architecture, which exploits the comparator resolve time for residue transfer without additional circuitry.

Figure 1:
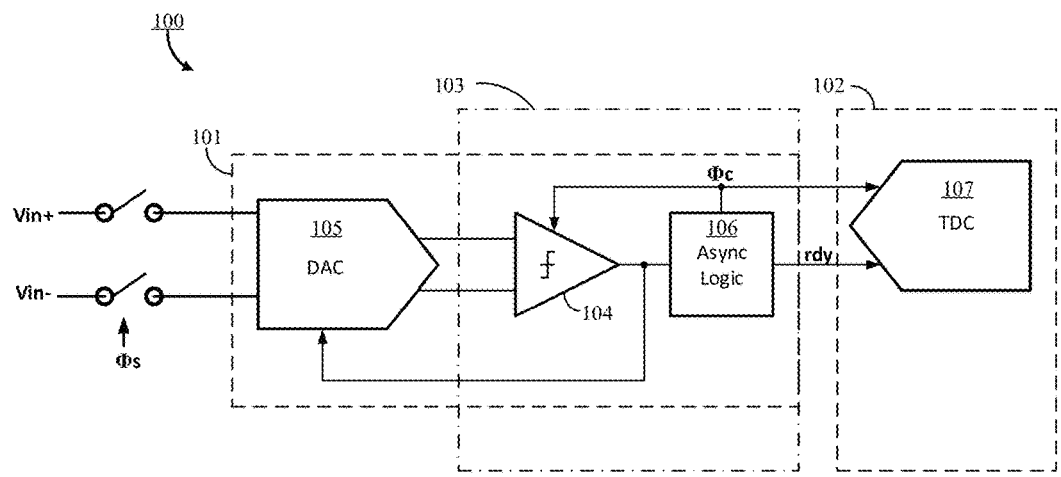
FIG. 1 shows a block diagram of a voltage-time hybrid SAR ADC architecture.

FIG. 1 shows a block diagram of a voltage-time hybrid SAR ADC architecture. Referring to FIG. 1, a voltage-time hybrid SAR ADC 100 has a first stage 101 and a second stage 102. A voltage-to-time interface 103 connects the two stages and includes a comparator 104 for translating voltage-domain residue to the time domain. The first stage 101 is a SAR ADC and the second stage is a time-to-digital converter (TDC) 107. A first set of bits can be generated by the SAR ADC (e.g., the N1 bits described above) and a second set of bits can be generated by the TDC (e.g., the N2 bits described above). For example, the SAR ADC may resolve 3 bits in the voltage domain during coarse comparisons. The fourth bit resolving time contains the residue information, which, in addition to being resolved in the voltage domain can be passed to the second stage to resolve for another 4 bits in the time domain.

The SAR ADC can include a comparator 104, digital to analog converter (DAC) 105, and asynchronous logic 106. The TDC 107 quantizes a time difference between two output signals of the first stage 101 to resolve multiple bits from the residue provided by the first stage 101 (via the voltage-to-time interface 103). The two output signals received by the TDC 107 are from lines labeled as $\Phi_c$ (representing the comparator clock) and rdy (indicating completion of the comparison by the comparator 104).

In some cases, such as shown in FIG. 1, the comparator 104 and the asynchronous logic 106 are shared between the SAR ADC of the first stage 101 and the voltage-to-time interface 103. In this SAR ADC architecture, the comparator 104 is first used during the voltage-domain conversion of the first stage 101 and then reused in the interface 103 to generate time-domain information, which is passed to the second stage 102. The reuse of the comparator 104 can lead to improved efficiency as it does not require extra devices as compared to traditional ADCs. Power consumption can decrease without losing ADC performance.

As mentioned above, the first stage 101 can operate according to a typical SAR ADC for a first set of bits. As part of the typical SAR ADC operation, the comparator 104 receives a differential output voltage from the DAC 105 and compares the two voltages to determine which output voltage is larger. The comparator 104 serially outputs the result of the comparison, indicating which output voltage from the DAC 105 is larger. Registers (or other storage mechanisms), internal or external to the DAC 105, capture and store the output of the comparator 104 to perform a successive approximation. As an illustrative example of the process carried out by the first stage 101, the SAR ADC may operate according to a typical SAR ADC for a first set of 10 bits. The 10 bits will be equivalent to $2^{10}$, or 1024, voltage levels. Given a 1V range for input voltage, the input range of 1V divided by 1024 levels gives an approximate value of 1 mV per step of the converter. Thus, a 1V voltage range can be resolved into approximately 1000 steps of 1 mV each. The role of the SAR converter is to perform this conversion from analog input voltage to a digital representation of the voltage. Since the SAR converter produces 1 bit per clock cycle, 10 clock cycles will be needed to represent the 10 bits in the example.

The SAR ADC can receive input of differential voltage pair, $V_{in}^+$ and $V_{in}^-$, that have been sampled by, for example, a sampling clock $\Phi_S$. The DAC 105 of the SAR ADC serves two functions; the DAC 105 not only performs as a digital-to-analog converter, but also performs as a sampler. That is, the DAC 105 functions as a sampler when the DAC 105 samples the input voltage, $V_{in}$, at clock cycles determined by the sampling clock signal, $\Phi_S$, and stores the analog voltage input.

As is well understood in the art, the SAR ADC functions as a binary search algorithm. The binary search algorithm is very efficient in that it only requires one comparison per bit.

As an illustration, for the example discussed above with a 1V input voltage range, the SAR converter compares the input voltage to a $V_{DAC}$ of 0.5V. If the input voltage is larger than 0.5V, then it is understood that the input voltage value is between 0.5V-1V and a logical 1 can be output. If the input voltage is smaller than 0.5V, then it is understood that the number is between 0-0.5V, and a logical 0 can be output. A convenient way to perform the search is to subtract the input voltage from 0.5V and compare the result to determine if the result is larger than 0 or not. The DAC 105 performs the subtraction operation and the comparator 104 performs the comparison operation to make the decision.

In the first clock cycle of the sampling clock, the most significant bit (MSB) is produced, and then the process repeats with the second clock cycle producing the second bit, and so on. The previous bits are stored in storage (not shown) in or coupled to the DAC 105 using the feedback connection from the comparator 104.

When the SAR reaches the least significant bit (LSB), all previous decisions can be recalled from the storage (not shown) for outputting to an appropriate digital circuit or processor as the first set of bits generated by the SAR ADC (e.g., the N1 bits described above).

The difference between the input voltage and the voltage needed to operate the binary search, $V_{DAC}$, is called the residue voltage, $V_{res}$. According to embodiments of the invention, after the N1 bits are generated, a final comparison is performed where the residue voltage $V_{res}$ is output from the DAC 105 as the input to the comparator 104. The residue sign (e.g., whether the result of the subtraction is positive or negative) is determined by the outcome at the comparator 104. When the comparator 104, functioning as a voltage-to-time interface, it also passes the magnitude information about the residue voltage, $V_{res}$, to the second stage in order to digitize the residue magnitude based on the quantized comparator resolving time, as discussed in more detail below.

Figure 2:
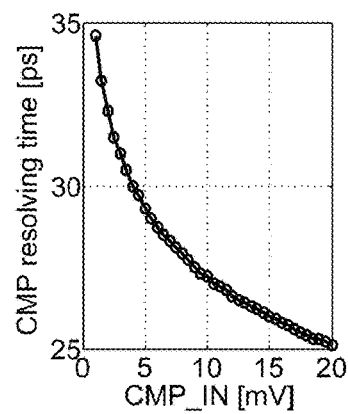
FIG. 2 shows a plot of comparator input voltage verses comparator resolving time for a general SAR ADC.

That is, a residue production technique is performed that exploits the resolving time dependence of the voltage-domain SAR comparator to achieve multibit second stage quantization in the time domain. In detail, FIG. 2 shows a plot, in semi-log scale, of comparator input voltage verses comparator resolving time for a general SAR ADC. In particular, FIG. 2 graphically illustrates the relationship between comparator input voltage and comparator computing, or "resolving", time. It can be seen that the resolving time is approximately inversely proportional to the input voltage amplitude. That is, if the difference between the two input voltages to the comparator, $V_{res}$, is large, the comparator can make a decision, or comparison, very quickly. For example, if the magnitude of the voltage difference between the two inputs is 100 mV, the comparator can decide very quickly compared to a voltage difference between the two inputs of 0.1 mV.

The comparator in the first stage SAR ADC is a natural residue amplifier (RA), meaning that when the first stage residue signal is presented to the comparator, with a small residue magnitude, its resolving time can be expressed as:

$$t_{cmp}=t_0-\tau_{cmp}\cdot\ln(V_i/V_0), \quad (1)$$

where the resolving time of the comparator is defined as the time lapse from when the comparator is strobed until it outputs a decision. The input magnitude information is embedded in the comparator resolving time (see e.g., the relationship between input voltage and resolving time FIG. 2). As expressed in Equation (1) and shown graphically in FIG. 2, the speed of the comparator is related to its input voltage. Because speed is an inverse of time, the comparator can be used as a voltage-to-time converter. In addition to the comparator 104, the voltage-to-time interface also includes the asynchronous logic 106 and additional logic used to monitor the speed of the comparator (discussed in more detail with respect to FIGS. 3A and 11A).

The asynchronous logic 106 generates an asynchronous clock signal on-chip for the voltage-time hybrid SAR ADC. The asynchronous clock signal can provide the comparator clock signal, $\Phi_c$, which is used by the comparator 104 to trigger the comparator 104 to begin making a decision. The comparator 104 can make a decision at each rising edge of the comparator clock cycle. In this manner, the comparator clock signal also represents the voltage-to-time conversion time. The comparator clock signal, $\Phi_c$, is sent to both the comparator 104 of the first stage and as an input to the second stage. The asynchronous logic 106 also outputs a ready signal (rdy). The rdy signal may initially be at $V_{DD}$. Once the comparator 104 makes a decision, the rdy signal will fall to ground, or 0V. The time lapse from the rising edge of $\Phi_c$ to the falling edge of rdy is the comparator conversion time.

As mentioned above the time-domain converter second stage 102 includes a TDC 107 that receives the comparator clock signal $\Phi_c$ and the rdy signal. Additional logic (not shown) can be included, if needed, to amplify the time difference between $\Phi_c$ and rdy, from the first stage into the second stage. The role of the TDC 107 is to quantize the conversion time described above into multiple digital bits.

According to embodiments of the subject invention, a multi-bit residue is passed from the output of the SAR to the TDC to resolve the time difference between the two signals, $\Phi_c$ and rdy, not merely which of the two signals occurred first. In other words, rather than simply passing along which signal is faster as a single bit of data, the difference between the two signals is passed, which represents multiple bits.

Figure 3A:
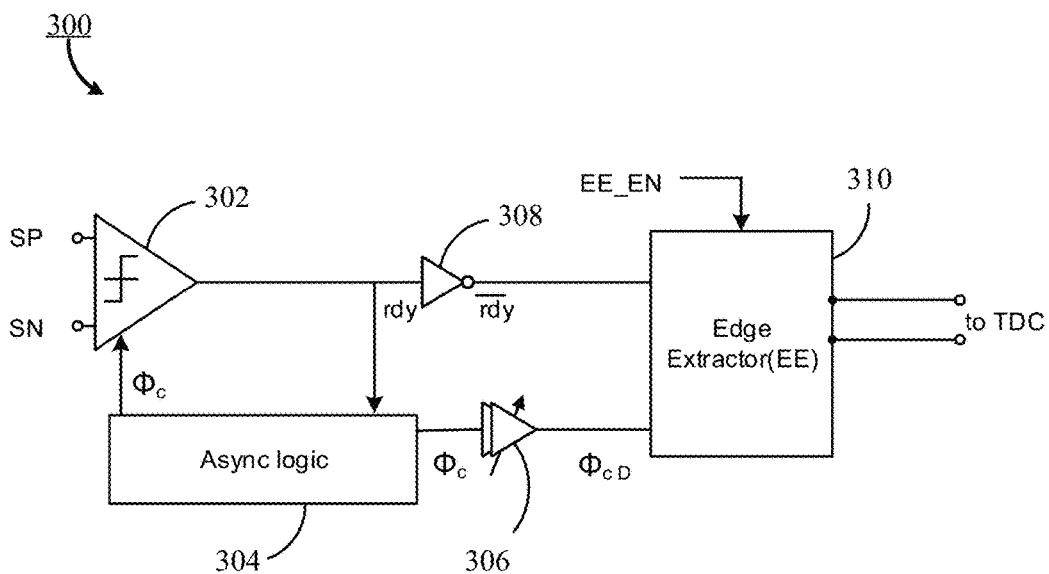
FIG. 3A shows an example voltage-to-time interface for a voltage-time hybrid SAR ADC.
Figure 3B:
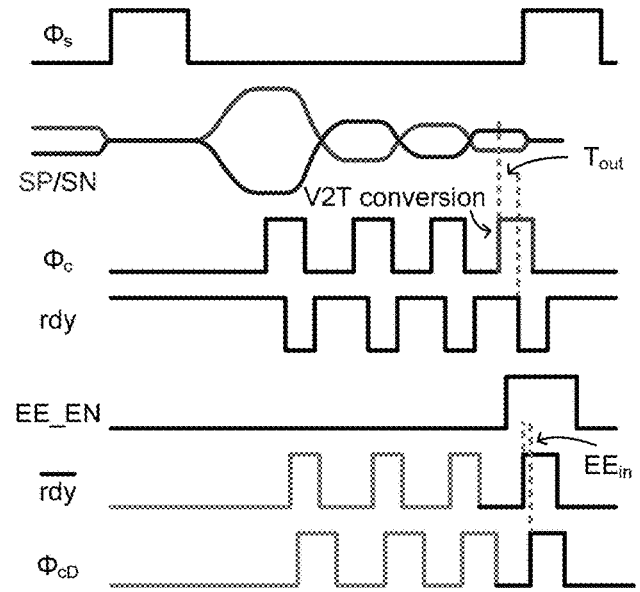
FIG. 3B shows an example timing diagram for the example voltage-to-time interface.

FIG. 3A shows an example voltage-to-time interface for a voltage-time hybrid SAR ADC; and FIG. 3B shows an example timing diagram for the example voltage-to-time interface. Referring to FIG. 3A, a voltage-to-time interface 300 can include a comparator 302; asynchronous logic 304 for generating the comparator clock signal, $\Phi_c$, and receiving the rdy signal from the output of the comparator 302; a variable delay line 306; RDY inverter 308; and an edge extractor (EE) 310. Referring to FIG. 3B, the timing diagrams include signals of the sampling clock $\Phi_S$ (at the input of the SAR ADC, e.g., of first stage 101 of FIG. 1); the positive signal SP and negative signal SN input to the comparator 302 (e.g., the differential output of DAC 105 of FIG. 1), which have a same magnitude but opposite polarity; the comparator clock ($\Phi_c$) generated by the asynchronous logic 304; a ready (rdy) signal; edge extractor enable signal (EE_EN); a "ready not" ($\overline{rdy}$) signal; and a delayed comparator clock signal ($\Phi_{cD}$).

As previously discussed, the comparator 302 makes one decision for each corresponding bit. Assuming a 3-bit SAR ADC, the comparator 302 makes one decision per bit (for a total of 3 decisions) plus an additional fourth comparison based on an input received based on a first cycle of the sampling clock, as seen by the four comparator clock pulses ($\Phi_c$). The fourth comparison is performed as the voltage-to-time conversion. The TDC only quantizes the comparator conversion time for the fourth decision, and not the first 3 decisions. Therefore, The EE circuit 310 is included in the voltage-time interface to capture only the last (in this example, the $4^{th}$) rising edge of $\Phi_c$. By using the EE circuit 310, the conversion time of the first three comparator decisions can be ignored. The EE circuit 310 is enabled when the EE_EN signal goes high. When the EE_EN signal goes high, the EE circuit 310 captures the fourth ready signal (in this case in the form of $\overline{rdy}$) and the delayed $\Phi_c$ ($\Phi_{cD}$). The time difference between the $\Phi_c$ and rdy in the fourth cycle will be passed to the TDC. The TDC can resolve multiple bits from the time difference between $\Phi_c$ and rdy (or $\Phi_{cD}$ and $\overline{rdy}$). For example, if the TDC has a resolution of 1 s, and the difference is 10 s, then 10 bits of information can be obtained.

As described above, the residue magnitude (Vres) of the last comparator decision is digitized based on the quantized comparator resolving time (e.g., the time difference between the comparator clock and the ready signal). However, since only the absolute value of the amplitude of $V_{res}$ is passed to the second stage, polarity information is lost. However, the polarity information, either in the form of a "1" or "0", occurs in the final comparison bit cycle of the first stage (e.g., bit 4)—as the comparison outcome. Once the first stage quantization of 4 bits is combined with the 4 bits in the second stage, the sign and amplitude information will meet again and the quantization of information will be complete. That is, the first stage performs the coarse comparison, resulting in the coarse bits; and the second stage infers multiple bits from the residue to generate the refined bits. Combining the refined bits with the coarse bits results in the full amount of bits in the digital format.

The EE circuit, asynchronous logic, and rdy signal are all related to determine how to accurately store time information and pass that information to the second stage.

This example shows 4 bits in the first stage and 4 bits in the second stage (for a total of 7 to 8 bits, but possibly less depending on overhead), but the number of bits is application specific. Typically, 6 to 8 bits are used for high speed data farms. Theoretically, there is no limit to the number of bits as long as the residue information can be accurately processed. In some cases, it is possible to generate 12 to 14 bits from the two stages. For example, 6 to 14 bits may be generated in total. The two stages may output a same or different number of bits depending on resolution available. In some cases, the second stage outputs 4 to 8 bits.

The nonideality of the voltage-to-time conversion process (as illustrated in FIG. 2) is its inherent nonlinearity. If a linear TDC is used for the second stage, the output of the second stage cannot be used effectively without first being linearized. An analog approach for linearization is to distort the TDC transfer function in the same manner the residue is distorted. A digital solution for linearization is to somewhat increase the TDC resolution and utilize a look-up table (LUT) in the digital domain to linearize the overall voltage to time conversion and time to digital conversion response. While both techniques can work reliably, the digital approach can scale better with the technology.

Figure 4:
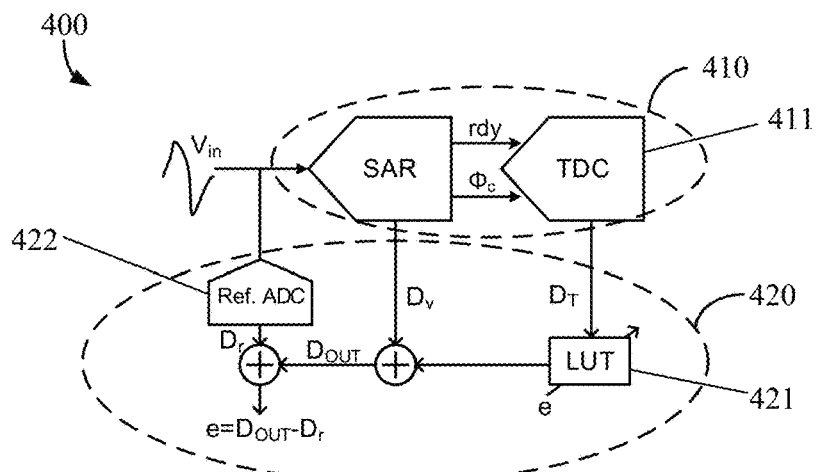
FIG. 4 shows a conceptual diagram of a voltage-time hybrid SAR ADC with nonlinearity calibration by digital postprocessing according to one example implementation.

FIG. 4 shows a conceptual diagram of a voltage-time hybrid SAR ADC with nonlinearity calibration by digital postprocessing according to one example implementation. Referring to FIG. 4, a hybrid SAR ADC with nonlinearity calibration 400 can include the two-stage SAR ADC 410 and digital postprocessing circuitry 420.

Digital post-processing circuitry 420 can be used to correct the voltage-to-time nonlinearity. With a nonlinear voltage-to-time transfer and a linear TDC 411, the input-referred voltage-domain decision levels are unevenly spaced. As long as the output codes of the second stage ($D_T$) can be mapped to the correct residue amplitude, the input value can be properly derived. In some cases, to minimize the input-referred quantization noise, a 4-bit, rather than a 2-bit, TDC 411 may be employed in the second stage to compensate for the low conversion gain region. The mapping can be realized by a lookup table (LUT) 421. With a known input signal, the LUT coefficients can be learned in the foreground; but with process, voltage, and temperature (PVT) variations the LUT needs to be updated adaptively. A reference ADC 422 allows the LUT 421 to be trained in the background. The reference ADC 422 and the two-stage hybrid SAR ADC 410 sample the same input (Vin); thus, it is expected that the digital outputs $D_r$ and $D_{OUT}$ of the reference ADC 422 and the two-stage hybrid SAR ADC 410, respectively, will be identical. Any difference between $D_r$ and $D_{OUT}$ can be used to train the LUT 421 until $D_r=D_{OUT}$ holds.

Figure 5A:
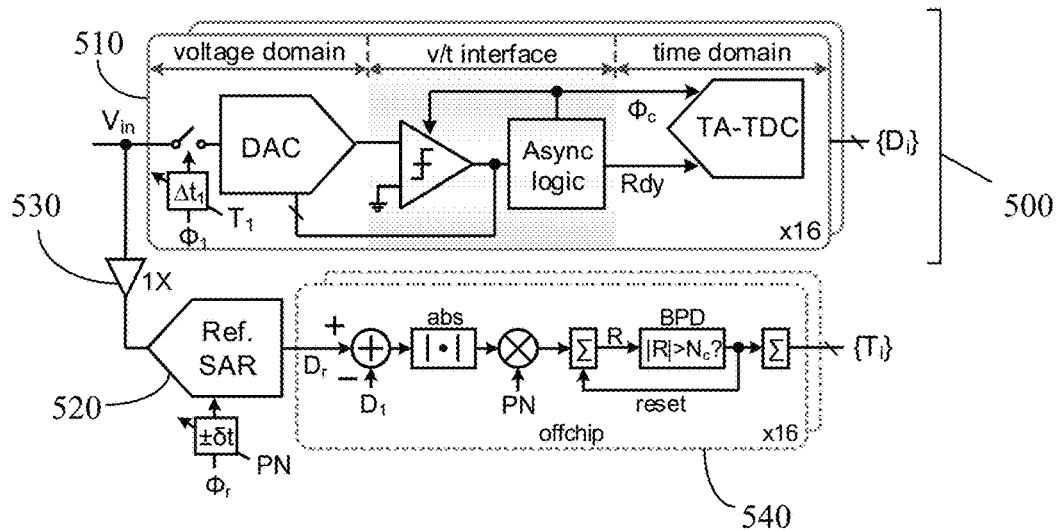
FIG. 5A shows an example system incorporating voltage-time hybrid SAR ADC architecture. The system shown in FIG. 5A involves a 16-way time-interleaved ADC array with a reference DC for a skew calibration scheme.

Example Implementation of a Voltage-Time Hybrid SAR ADC for a 16-Way Time-Interleaved ADC Time interleaving can be used within ADCs to achieve very high data rates of at least 20 GB/s. FIG. 5A shows an example of a 16-way time-interleaved ADC array. Typically, in order to achieve very high speed (on the order of tens of GHz or higher) operation, multiple single slice converters are needed to work in parallel. Referring to FIG. 5A, 16 "single slice" voltage-time hybrid SAR ADCs form an interleaved array 500. Each "slice" 510 can be configured, for example, as described with respect to FIG. 1. These identical single slice ADCs 510 work in parallel. A system clock directs each ADC 510 when to convert, when to finish, and when to output bits one after the other. Within every clock cycle, the cycle is divided into 16 uniform phases, or divisions. One of the 16 ADCs will convert under the direction of the clock during a specified segment.

Analog circuits differ from digital circuits in that analog circuits deal with very detailed information. Any imperfections in the circuit, such as during the manufacturing or fabrication process, can interfere with the accuracy of the analog circuit. For example, the timing information may be subject to imperfection because the clock cycle must be divided uniformly into 16 divisions. The actual implementation of the 16 uniform divisions cannot be performed with complete accuracy. Once the 16 time divisions are passed to the 16 single slice ADCs, the divisions will be somewhat skewed, meaning the time is not exactly 1/16 of a clock cycle. Rather, the time will be 1/16+timing skew, $\Delta t_i$. A timing skew adjustment, $\Delta t_i$, can be applied.

Figure 5B:
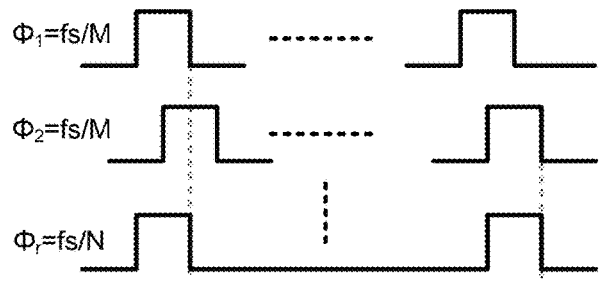
FIG. 5B shows an example timing diagram for the 16-way time-interleaved ADC array of FIG. 5A.

A sampling switch, $\Phi_i$, determines when the input signal is captured for a slice i. The sampling of the input signal should be uniformly spaced 16 times every clock cycle. The main idea of the timing skew is to fine-tune the circuit such that all 16 slices can be very accurately clocked as the system requires. The process of fine-tuning the circuit is referred to as timing skew calibration. FIG. 5B shows an example timing diagram for the 16-way time-interleaved ADC array.

For timing-skew correction among the 16 slices, a reference ADC is included. In addition, 16 digitally controlled delay lines (DCDL) are employed to fine-tune the clock phases of the 16 time-interleaved paths to align with the reference path.

In addition to timing skew, other analog imperfections also exist between the 16 slices. Other mismatches, such as capacitive mismatch or random mismatch, may occur during manufacturing. These mismatches are referred to as static mismatch and can affect the conversion characteristics of the ADC slices. In a system, once the slices are interleaved, it is desirable for the slices to be identical and uniform. This uniformity can be achieved by using a reference ADC (Ref ADC) 520, or reference signal path. The reference signal output from the Ref SAR 520 converts the input voltage, $V_{in}$, which is routed into the Ref SAR 520 through a 1X buffer 530. The Ref ADC 520 converts at a very slow speed, in the range of 10-100 times slower than the slice ADC array 500.

The slow processing speed can produce a very accurate quantization of the input signal, $V_{in}$. The Ref SAR 520 compares the accurate reference ADC output to the inaccurate sliced ADC output, shown as $D_i$ in FIG. 5A, which is a digital domain comparison. If the 2 digital bits are the same, then the slice ADC is accurate and not subject to any mismatch or imperfections. However, in most cases, there is a difference between the reference ADC output and the slice ADC output. Once the difference is detected, the difference can be compared and more information about the error imperfections within the ADC slices can be learned. This is a way of tuning the imperfections, or mismatch, in the interleaved converter arrays. This is called a reference path calibration, as shown in the bottom circuit block 540 of FIG. 5A.

Figure 6:
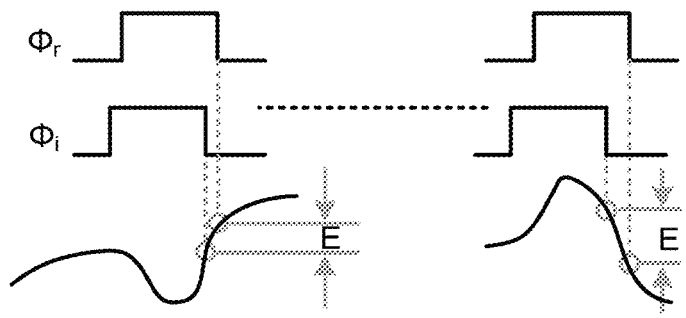
FIG. 6 shows an example timing diagram of a skew-induced conversion error.

In the presence of timing skew, sampled values of the reference ADC and sub-ADC will be different. FIG. 6 shows an example timing diagram of a skew-induced conversion error. In this diagram, the reference ADC sampling clock $\Phi_r$ is assumed to be lagging the sub-ADC$_i$ sampling clock $\Phi_i$ (i.e., $\Phi_r = \Phi_i + \Delta t_i$ with $\Delta t_i > 0$). With a reasonably small skew magnitude, the skew-induced error can be expressed as $$E \approx \Delta t_i \cdot \frac{dV}{dt}. \quad (2)$$

The error magnitude is proportional to the skew magnitude.

Figure 7:
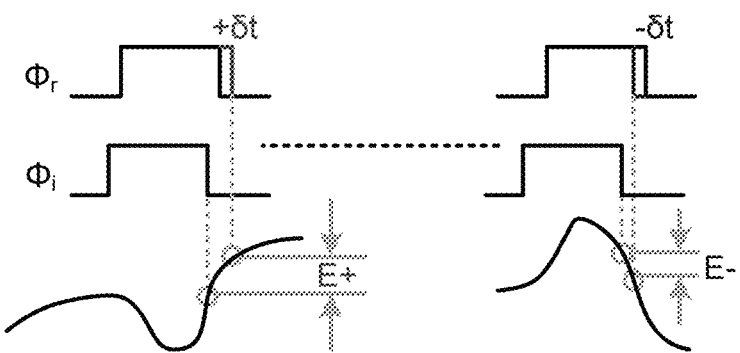
FIG. 7 shows an example of skew sign estimation.

To estimate the skew value, a DCDL can be used to dither $\Phi_r$. The DCDL delays or advances $\Phi_r$ by $\delta t_r$, depending on its digital control bit. FIG. 7 shows an example of skew sign estimation. The skew-induced error after dithering can be expressed as $$E = (\Delta t_i \pm \delta t_r) \cdot \frac{dV}{dt}. \quad (3)$$

The average absolute error with advanced $\Phi_r$ and delayed $\Phi_r$ can be written as $$\overline{|E_+|} = \overline{|D_r - D_i|} = \left|\Delta t_i + \delta t_r\right| \cdot \overline{\left|\frac{dV}{dt}\right|}, \quad (4)$$

$$\overline{|E_-|} = \overline{|D_r - D_i|} = \left|\Delta t_i + \delta t_r\right| \cdot \overline{\left|\frac{dV}{dt}\right|}. \quad (5)$$

It can be assumed that $\Delta t_i > 0$, $|\Delta t_i + \delta t_r| > |\Delta t_i - \delta t_r|$, thereby $\overline{|E_+|} > \overline{|E_-|}$. Thus, the skew sign can be estimated by $$\operatorname{sign}(\Delta t_i) = \operatorname{sign}(\Sigma|E_+| - \Sigma|E_-|). \quad (6)$$

If $\Delta t_i < 0$ holds, the converse scenario would be true for $\overline{|E_+|}$ and $\overline{|E_-|}$, as well as the sign relationship. Assuming that $\Phi_r$ is delayed and advanced for the same number of iterations, summation can be used to replace averaging. The estimated skew sign is then accumulated and low-pass filtered to drive a DCDL to align $\Phi_i$ to $\Phi_r$. The RHS (right hand side) of (6) becomes zero when $\Delta t_i$ reaches zero and the skew calibration is complete.

If, for example, the sub-ADC and the reference ADC are both 6 bit and the input is $A \cdot \sin(\omega t)$, the dither-induced sampled value difference can be expressed as $A\omega \cdot \cos(\omega t) \cdot \delta t$. The maximum sample difference is thus $A\omega \cdot \delta t$. For this difference to be detected it needs to be larger than 1 LSB, where 1 LSB=A/32. Once the difference is detected to be larger than 1 LSB, then derivation shows that $\delta t > 1/(64\pi \cdot f)$ is required. On the other hand, the dither magnitude cannot be too large. If the input signal exercises more than half a period within the dither gap, the skew estimation will fail. In this example, the dither magnitude is restricted to be less than a quarter of the input signal period, i.e., $\delta t < 1/(4f)$ holds. For example, for f=10 GHz, $\delta t$ needs to be within [500 fs, 25 ps] and for f=1 GHz, $\delta t$ needs to be within [5 ps, 250 ps]. In this example, to cover input frequencies from 1 to 12 GHz, the dither range is set to [5 ps, 20 ps].

Figure 8:
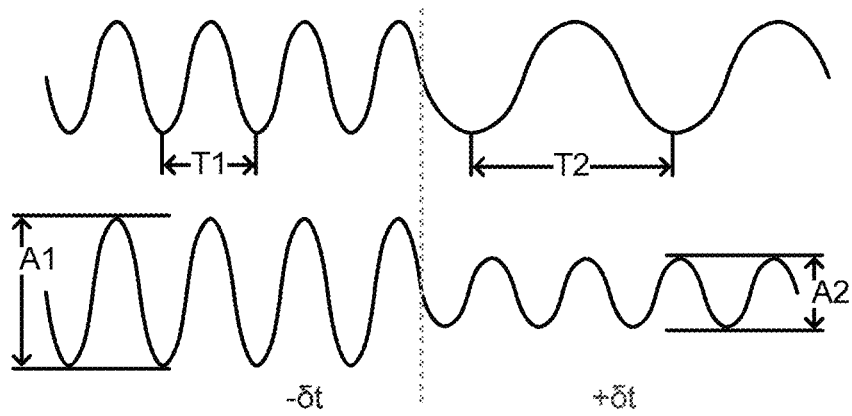
FIG. 8 shows an example of a problematic scenario for skew estimation.

One potential issue related to the above skew calibration scheme is that the modulation pattern of the reference ADC might be correlated with the input signal. FIG. 8 shows an example of a problematic scenario for skew estimation. As shown in FIG. 8, if T1<<T2 or A1>>A2, $\Phi_r$ is always delayed when dV/dt is large or advanced when dV/dt is small. In this case, (4) and (5) can be rewritten as $$\overline{|E_+|} = |\Delta t_i + \delta t_r| \cdot \overline{\left|\frac{dV}{dt}\right|}_{large}, \quad (7)$$

$$\overline{|E_-|} = |\Delta t_i + \delta t_r| \cdot \overline{\left|\frac{dV}{dt}\right|}_{small}. \quad (8)$$

And the relative magnitude of $\overline{|E_+|}$ and $\overline{|E_-|}$ is independent of $\Delta t_i$. Instead, the relative magnitudes of $\overline{|E_+|}$ and $\overline{|E_-|}$ mainly depend on the magnitude of dV/dt. Thus, the skew information cannot be extracted by comparing $\overline{|E_+|}$ to $\overline{|E_-|}$. To avoid this scenario, the DCDL control signal for $\Phi_r$ is chosen to be a 1 bit pseudorandom noise (PN). When PN=+/−1, the DCDL delays/advances $\Phi_r$, respectively.

Figure 9A:
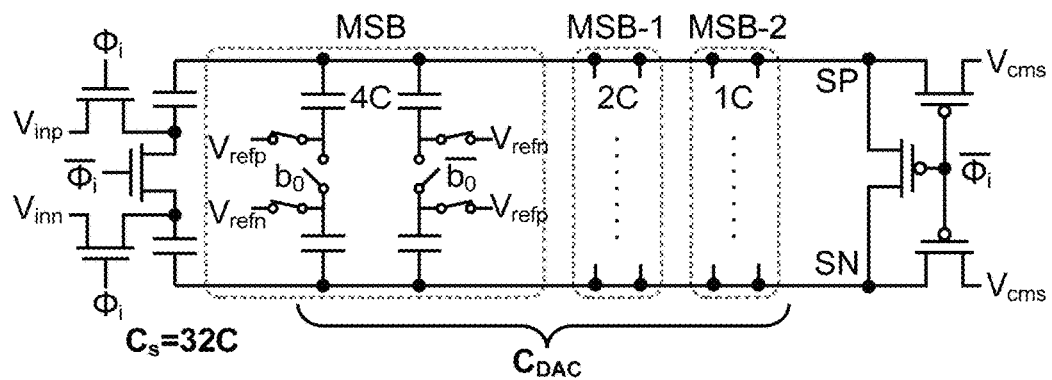
FIG. 9A shows an example of a DAC circuit in the SAR ADC.
Figure 9B:
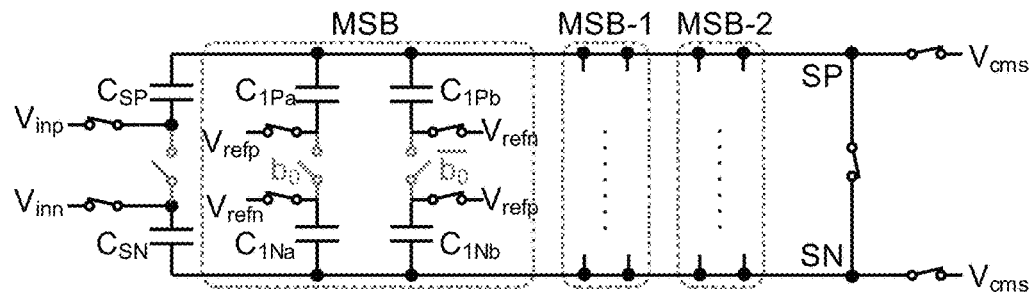
FIG. 9B shows a simplified DAC circuit in the tracking phase.
Figure 9C:
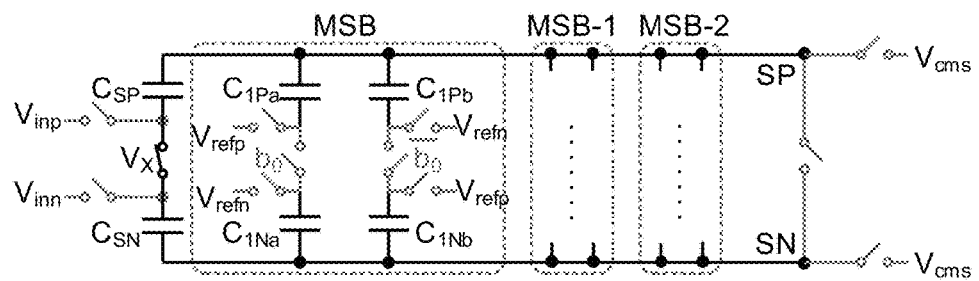
FIG. 9C shows the DAC configuration after the tracking phase.

Another problem for time-interleaved ADCs is crosstalk through reference power lines. In the proposed voltage-time hybrid SAR ADC architecture, a reference-buffer-free capacitive DAC (CDAC) is used as the DAC 401 to mitigate crosstalk between sub-ADCs, or single-slice ADCs. FIG. 9A shows an example of a DAC circuit within the SAR ADC. This example shows fully differential input voltages, $V_{inp}$ and $V_{inn}$, also referred to in the application as $V_{in}^+$ and $V_{in}^-$. In this embodiment, a sampling capacitor $C_S$ and the DAC capacitor, $C_{DAC}$, are separated. $C_S$ and $C_{DAC}$ are used to sample $V_{inp}$ and $V_{inn}$, and $V_{refp}/V_{refn}$, respectively, during the tracking phase. FIG. 9B shows a simplified DAC circuit in the tracking phase. FIG. 9C shows the DAC configuration after the tracking phase in which all switches in $C_{DAC}$ are open and the Vx crowbar switch shorts the bottom plates of $C_{SP}$ and $C_{SN}$. As a result, only $C_S$ and the related charge are involved in the trailing charge redistribution. The summing-node differential voltage is $-V_{in}$. The comparator can then be strobed to make the MSB decision.

Figure 9D:
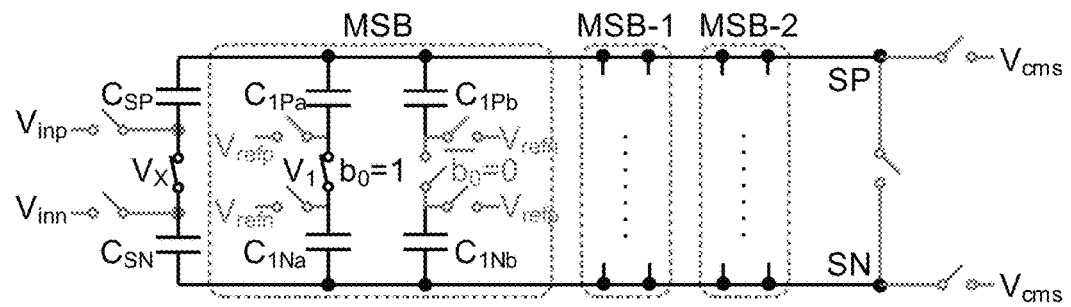
FIG. 9D shows the DAC configuration in the most significant bit (MSB) DAC charge-redistribution phase.

Depending on the MSB decision by the comparator, one of the MSB capacitor pairs are shorted by its own crowbar switch. FIG. 9D shows the DAC configuration in the MSB DAC charge-redistribution phase. In FIG. 9D, the bottom plates of $C_{1Pa}$ and $C_{1Na}$ are shorted and the bottom plates of $C_{1Pb}$ and $C_{1Nb}$ are left floating. With $C_{sp}=C_{sn}=C_s$ and $C_{1Pa}=C_{1Pb}=C_{1Na}=C_{1Nb}=C_1$, the summing-node differential voltage can be derived as $$V_{SP} - V_{SN} = \frac{-(V_{refp} - V_{refn}) \cdot C_1 - V_{in} \cdot C_S}{C_1 + C_S}. \quad (9)$$

In the proposed ADC architecture, $V_{refp}$ and $V_{refn}$ are VDD and GND, respectively, and (9) can be further simplified to $$V_{sp} - V_{sn} = \frac{-C_s}{C_{tot}} \left( V_{in} + \frac{C_1}{C_s} V_{DD} \right). \qquad (10)$$

With $C_1/C_s$ as the MSB weight, the structure behaves in the same manner as a conventional SAR DAC. After the DAC voltage settles, the comparator can make the MSB-1 decision and the same operation is then repeated. Eventually, the summing-node voltage can be expressed as $$V_{sp} - V_{sn} = \frac{-C_s}{C_{tot}} \left( V_{in} + V_{DD} \sum D_i \cdot \frac{C_1}{C_s} \right). \qquad (11)$$

The reference voltage of the DAC is separated from other blocks and shared by all sub-ADCs. During the bit cycles, $C_{DAC}$ is totally disconnected from the reference power lines. Thus, the crosstalk is greatly reduced. In the tracking phase when $C_{DAC}$ is precharged, the kickback from $C_{DAC}$ to the reference lines can be nearly constant since half of $C_{DAC}$ is intact and the other half can be discharged to VDD/2 from the last sample.

Conventionally, SAR ADCs utilize VDD/GND as $V_{refp}/V_{refn}$, respectively, and support an input swing of $2VDD_{pp}$ with $\Sigma C_i = C_s$. However, high-speed, low-resolution ADCs often use a smaller input swing to improve the tracking performance. In the proposed SAR ADC architecture, $C_{DAC}$ can be scaled down to attenuate $V_{ref}$ as it is separated from $C_s$. With, for example, $V_{ref}$=850 mV for the target technology, $C_1=C_s/8$ is chosen to cover a differential input swing of 425 $mV_{pp}$.

Since bottom-plate sampling is used in this proposed SAR ADC and the input swing is smaller than $2VDD_{pp}$, both the summing-node common-mode voltage ($V_{cms}$) (shown in FIGS. 9A-9D) and the input common-mode voltage ($V_{cmi}$) can differ from VDD/2. For example, $V_{cmi}$ of 125 mV can be chosen to allow a single NMOS input switch without bootstrapping, whereas a $V_{cms}$ of 600 mV can be chosen to accelerate the comparator. $V_{cms}$ can be supplied directly from an external source and shared by all sub-ADCs.

In the CDAC of FIGS. 9A-9D, $C_{tot}$ varies from cycle to cycle. $C_{tot}$ increases from $C_s$ to $C_s+\Sigma C_i$ from the MSB cycle to the LSB cycle. This means the attenuation of $V_{in}$ elevates as the bit cycles unfold. In a traditional design, $C_s = \Sigma C_i$, and the input is eventually attenuated by a factor of 2 from MSB to LSB, thus the input-referred comparator offset is eventually doubled. However, the SAR ADC cannot tolerate varying comparator offset and a comparator offset calibration must be performed. Since the $C_{DAC}$ is scaled in the proposed SAR ADC architecture, the variation of $C_{tot}$ is relatively smaller. For example, $C_{tot}$ changes from $C_s$=32 Cu to 39 Cu. As a result, the offset variation is also small. To avoid offset calibration, this error is absorbed into the inter-stage redundancy. The nominal residue range is [−15 mV, +15 mV], while the voltage-to-time interface and the second stage are designed to cover [−20 mV, +20 mV]. Behavioral simulation verifies that the scheme works well with comparator offset as large as 50 mV when offset is the only error source.

Figure 10A:
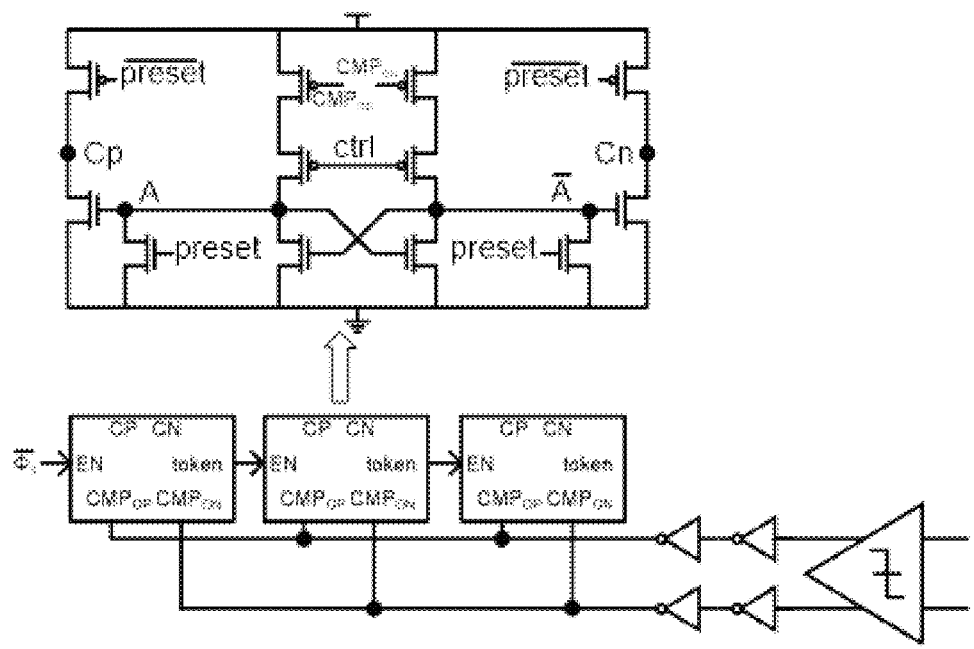
FIG. 10A shows an example of the proposed SAR logic circuit schematic.
Figure 10B:
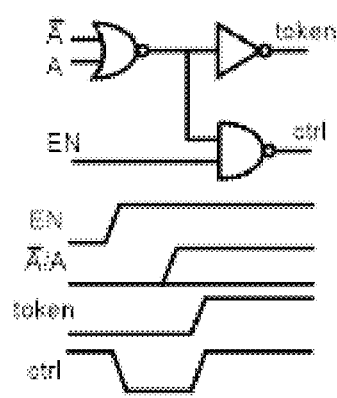
FIG. 10B shows a simplified timing diagram for the circuit of FIG. 10A.

FIG. 10A shows an example of the proposed SAR logic circuit schematic and FIG. 10B shows a simplified timing diagram for the circuit. The SAR operates in a domino-like fashion. When the current SAR logic captures the data from the output of the comparator, A/Ā generate a token signal which locks the data in the current SAR latch and then is used as the enable (EN) signal to enable the next SAR logic.

FIGS. 11A-11C illustrate DAC driver implementations. FIG. 11A shows an example of a DAC driver with additional common-mode switches. When the bottom plates of the DAC capacitors, $C_{DAC}$, are shorted, the voltage on the shorted node will become $(V_{refp}+V_{refn})/2$ if the parasitic capacitors on the P side, $C_p$, and N side, $C_n$, are the same (see FIG. 9A). If the voltage deviates from this value, the summing-node differential voltage $-V_{in}$ is not affected, but the common-mode voltage $V_{cms}$ will change, which can cause the comparator offset to vary. Since pMOS are used for node A and nMOS switches are used for node B, the parasitics are not the same. Additional switches can be added to tie the middle node to VDD/2. The DAC is no longer floating in this configuration and the summing-node common mode can become vulnerable to crosstalk with the additional common-mode switches. To resolve this problem, "dummy" switches are added to node A and node B to match their parasitic capacitances. FIG. 11B shows an example of dummy switches added to node A and node B. FIG. 11C shows that a voltage across the crowbar switches in $C_{DAC}$ is larger than VDD. As a result, the leakage current cannot be ignored in the target process. To address this issue, MN and MP are chosen as nominal threshold devices with a channel length of $2 \cdot L_{min}$. Short conversion phases also relax the leakage problem.

Figure 12A:
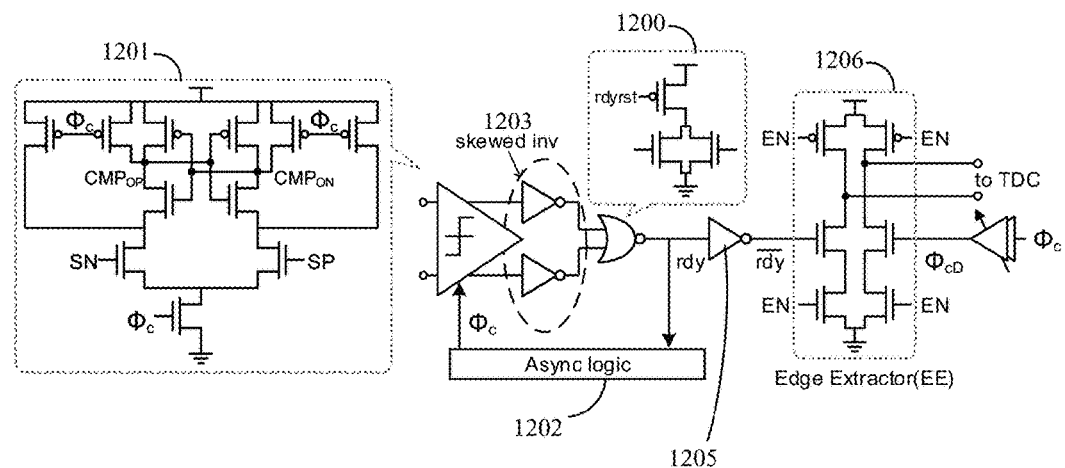
FIG. 12A shows an example circuit schematic for a voltage-to-time interface.
Figure 12B:
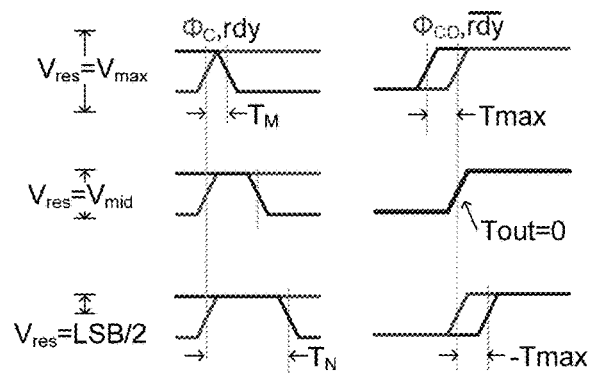
FIG. 12B illustrates the voltage to time signal waveforms for the voltage-to-time interface.

FIG. 12A shows an example circuit schematic for a voltage-to-time interface; and FIG. 12B illustrates the voltage to time signal waveforms for the voltage-to-time interface. The voltage-to-time interface 1200 comprises the comparator 1201 and an asynchronous logic circuit 1202. The asynchronous logic circuit 1202 receives the output from the comparator 1201. The output of the asynchronous logic circuit 1202 is passed to the second stage. The comparator 1201 is a standard strong-arm type. The differential outputs of the comparator 1201 are each fed into a buffer inverter 1203, which inverts the logic signal (for example, from logic "high" to logic "low"). A dynamic NOR gate 1204 receives the outputs from the two inverters 1203. The output of the dynamic NOR gate 1204 is fed into another inverter 1205 and then into an edge extractor (EE) circuit 1206. The dynamic NOR gate 1204 uses the buffered comparator outputs to generate the rdy signal. During the reset phase, both the comparator outputs and the rdy signal are high. When the comparator finishes making a decision, one of its outputs becomes low and the rdy signal is pulled low.

The buffer inverters 1203, located between the comparator 1201 output and the dynamic NOR gate 1204 input, are designed with a skewed threshold. That is, instead of sizing the pMOS and nMOS to have a threshold near $V_{DD}/2$, the nMOS is sized up to lower the threshold. A low threshold inverter is necessary to avoid the rdy generator being falsely triggered, which can occur when the input magnitude is small, after the comparator is strobed and before if finishes making a decision. The comparator clock, $\Phi_c$, and rdy signal are generated in each cycle by the asynchronous logic circuit, but only those in the 4th cycle need to be passed to the second stage for further processing. The token signal from the 3rd SAR asynchronous logic circuit is used to enable the edge extractor (EE) circuit 1206 to capture the 4th $\Phi_c$ rising edge and the rdy falling edge as shown in FIG. 3B. Before the EE circuit 1206 is enabled, both outputs are reset to VDD; after the EE circuit 1206 is enabled, the outputs are left floating. When the pull-down nMOS receives the rising rdy and the delayed $\Phi_c$ ($\Phi_{cD}$), the outputs are discharged and the time difference between them forms the voltage-to-time outcome.

Referring to FIG. 12B, the $\Phi_c$ and rdy signal are generated sequentially within the asynchronous logic circuit, so there is a fixed delay between rdy and $\Phi_c$ even with an infinitely large input. This fixed delay inevitably enlarges the voltage-to-time output range and may saturate the time amplifier (TA) in the second stage. The output time with the largest input voltage, for example, about 20 mV, is $T_M$ and the smallest input voltage, for example, about 2 mV (LSB/2) is $T_N$. For an input smaller than LSB/2, the output time is larger than $T_N$ and should be truncated to $T_N$. The purpose of the added delay line is to delay $\Phi_c$ such that $V_{max}$ is converted to $+T_{max}$ before the time-to-digital conversion (corresponding to the largest TDC code), while LSB/2 is converted to $-T_{max}$ (corresponding to the smallest TDC code). When the input voltage is in the middle, the output time is zero.

Regarding the time amplifier and TDC, circuit simulation reveals that a 20 mV input range into the first stage of the ADC results in an output time span of 10 ps. To resolve 4 bits, a TDC with a LSB size less than 1 ps is needed. Since a delay-line-based TDC is used in the proposed architecture, the LSB size is set by the technology, which is around 9 ps ($\approx$two inverter delay). The output from the voltage-to-time needs to be amplified before it reaches the TDC.

Figure 13:
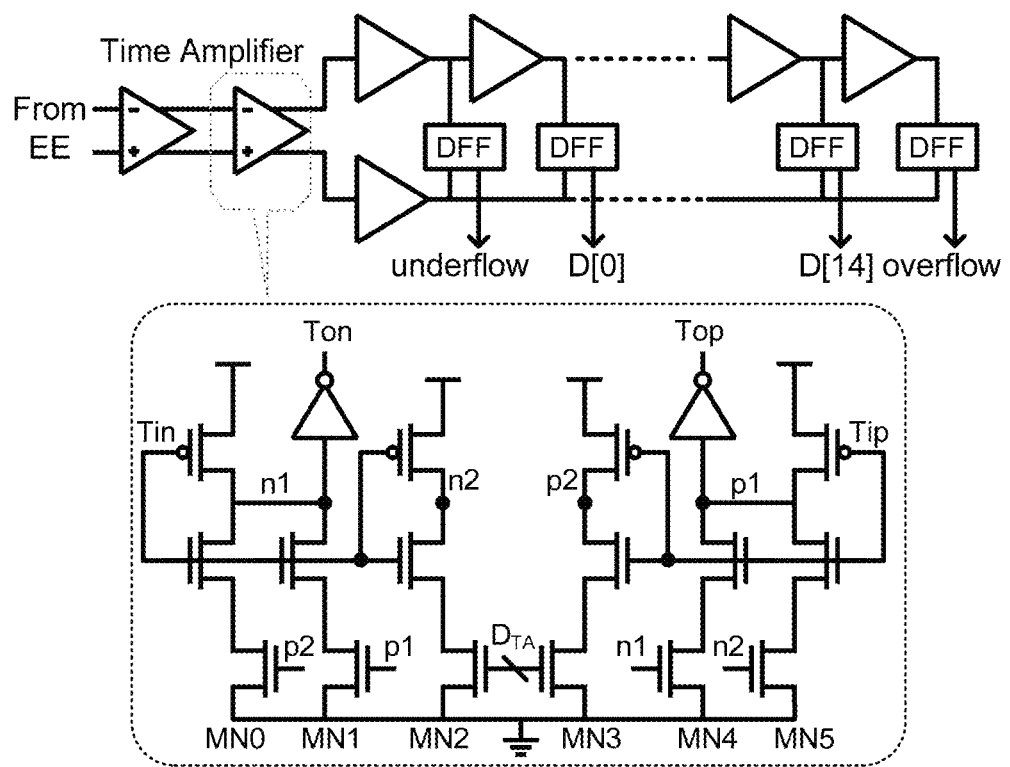
FIG. 13 shows a circuit schematic for an example implementation of a time-to-digital converter.

FIG. 13 shows a circuit schematic for an example implementation of a time-to-digital converter. As shown in FIG. 13, two cascaded time amplifiers (TA) are used to amplify the voltage-to-time output. The TA gain is digitally controlled by varying the sizes of MN2 and MN3, which control the discharging speed of the nodes n2 and p2. For both TAs, MN2 and MN3 are implemented as a 4-bit binary-weighted NMOS array. With an input time range into the second stage of, for example, [−20 ps, 20 ps], the TA can provide a gain ranging from 2 to 15.

The voltage-to-time gain, the TA gain, and the TDC LSB size are all subject to PVT variations. Therefore, the TA gain and the delay line for $\Phi_c$ must be made tunable to cover the variations. To assist the calibration, as shown in FIG. 13, underflow and overflow detectors are added before and after the first and last delay cells, respectively, in the 4-bit TDC. For example, when both detectors are triggered, the TDC must be saturated and the TA gain should be reduced.

Since the input to the voltage-to-time can be as small as zero, which converts to a large output time even with optimal digitally-controlled delay lines (DCDL) and TA settings, the underflow detector can still be triggered. When the first stage residue falls in the range of, for example, [−0.5LSB, 0.5LSB] and the underflow detector is triggered, it should be considered normal and the second stage output should be assigned to the minimum TDC code. With an evenly distributed residue signal, its probability of falling within [−0.5LSB, 0.5LSB] is 10% (with a 4 mV LSB and a 20 mV maximum residue). If the probability of the minimum TDC code plus the triggered underflow detector is less than 10%, the DCDL and TA settings need no update.

Figure 14A:
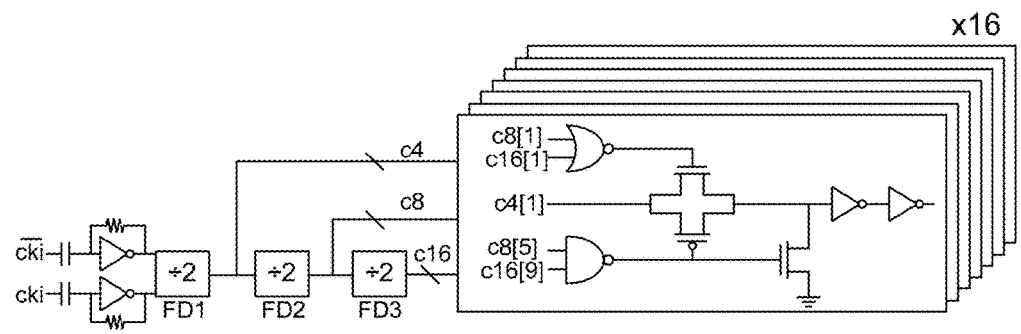
FIG. 14A shows an example of a multiphase clock generation circuit that may be used for time-interleaving in a system such as shown in FIG. 5A.
Figure 14B:
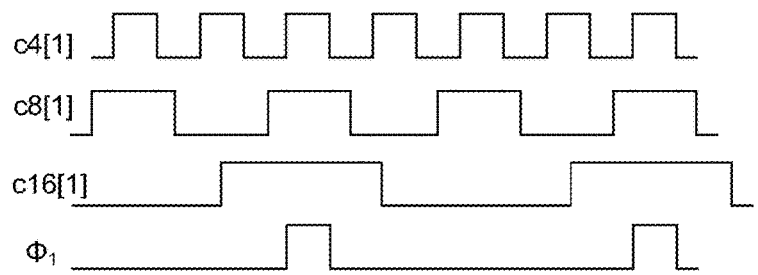
FIG. 14B shows a timing diagram for the sampling clocks for sub-ADCs.

FIG. 14A shows an example of a multiphase clock-generation circuit that may be used for time-interleaving in a system such as shown in FIG. 5A. In an example embodiment, differential clocks cki/$\overline{cki}$ at fs/2=12 GHz are used. Three cascaded divide-by-2 frequency dividers (FD) receive cki/$\overline{cki}$ and generate a 4-phase clock c4[1:4], an 8-phase clock c8[1:8], and a 16-phase clock c16[1:16] sequentially. Different phases from c8 and c16 are used to gate c4[1:4] to generate the sampling clock for each sub-ADC. FIG. 14B shows a timing diagram for the sampling clocks for sub-ADCs. The skew performance is mainly determined by c4, which has only one critical FD. Having only one critical FD makes maintaining a symmetrical layout easier, and FD2/FD3 can be downscaled to save power and area.

Figure 15:
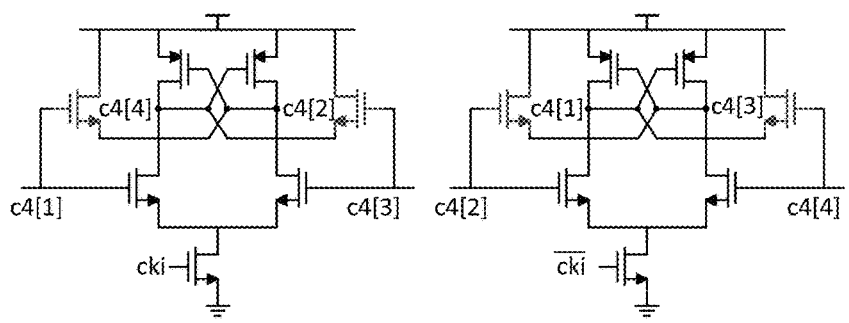
FIG. 15 shows an example of a divide-by-2 frequency divider (FD) circuit.

FIG. 15 shows an example of a divide-by-2 frequency divider (FD) circuit. The frequency dividers of FIG. 14A comprise cross-connected latches, as shown in greater detail in FIG. 15. A feedforward path is used, in which an nMOS source follower precharges the output node to speed up the latches. The FD1 output c4[1:4] consist of 4 well-defined phases; c4[1] through c4[4] are generated sequentially with a 90-degree phase spacing.

Figure 16A:
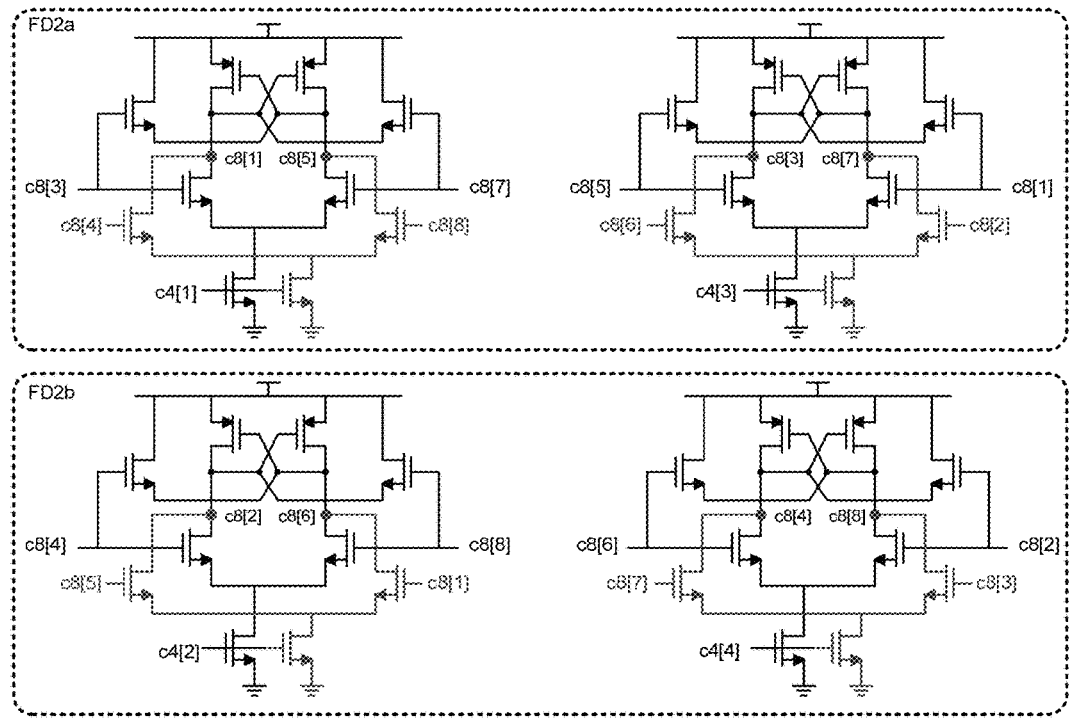
FIG. 16A shows a circuit schematic of an example FD circuit for FD2 shown in FIG. 14A.
Figure 16B:
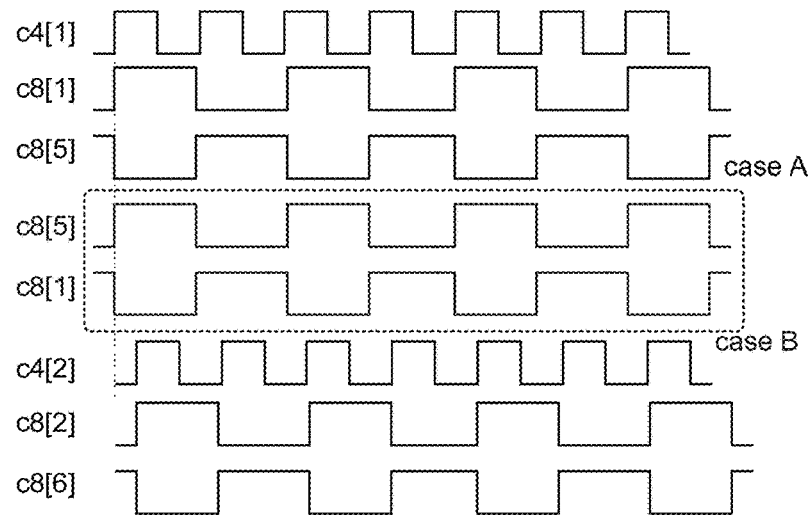
FIG. 16B shows an example of the two possible outputs, case A and case B, for FD2a shown in FIG. 16A.

FIG. 16A shows a circuit schematic of an example FD circuit for FD2 shown in FIG. 14A. FD2 comprises two separated FDs, for example, FD2a is driven by clock c4[1, 3] and FD2b is driven by c4[2, 4]. When c4[1, 3] triggers FD2a, two possible outputs can occur. FIG. 16B shows an example of the two possible outputs, case A and case B, of FD2a shown in FIG. 16A. Case A and Case B are indistinguishable if only the outputs of FD2a are considered. If the outputs from FD2b are also considered, a phase ambiguity problem can arise (there are two possible outcomes from FD2b as well, but for simplicity, only one case is shown here). If the FD2a output is case A, then the c8[1:8] are the correct outputs. However, if the FD2a output is case B, then the output sequence of FD2 becomes [1, 6, 3, 8, 5, 2, 7, 4]. To avoid the ambiguity, weak couplers can be added to ensure the phase relationship between the FD2a and FD2b. The same technique is also applied to the FD3.

Figure 17:
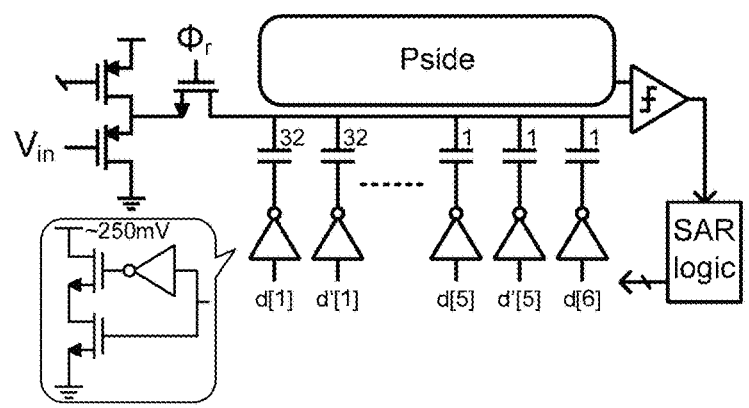
FIG. 17 shows a block diagram of an example reference ADC for the system of FIG. 5A.

An on-chip reference SAR ADC can be used to facilitate the skew calibration. FIG. 17 a block diagram of an example reference ADC for the system of FIG. 5A. The on-chip reference ADC can be clocked, for example, at fs/125 (~192 MHz). Since speed is not of concern, a conventional 7-bit SAR ADC can be used. A pMOS source follower is used to isolate the activity of the reference ADC and to translate $V_{cmi}$ from near ground to about VDD/2. An input buffer drives the reference ADC, but not the entire TI array. Since the input swing is smaller than 2VDD, an extra reference voltage of 250 mV can be used for the reference ADC.

Prototype Example

Figure 18:
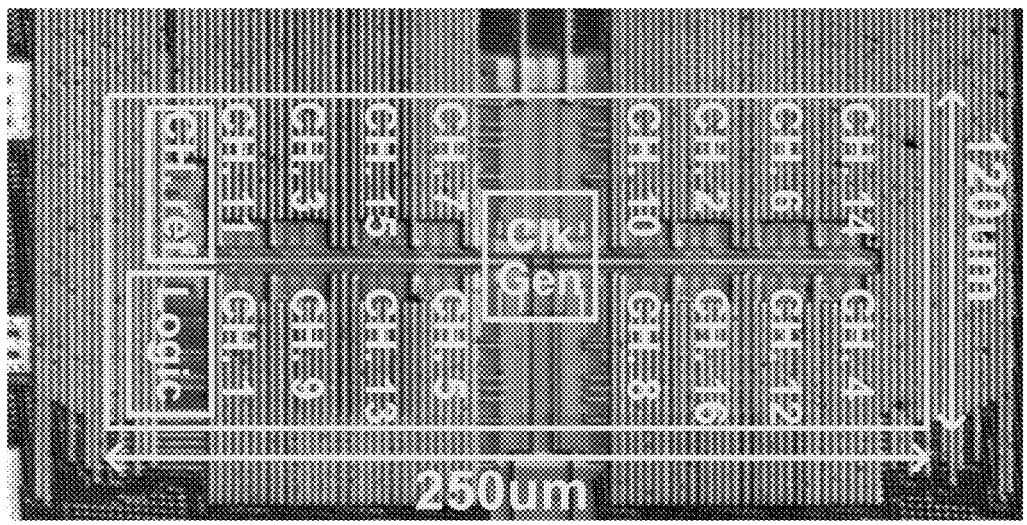
FIG. 18 shows a chip micrograph of a prototype implementing the system of FIG. 5A.
Figure 19A:
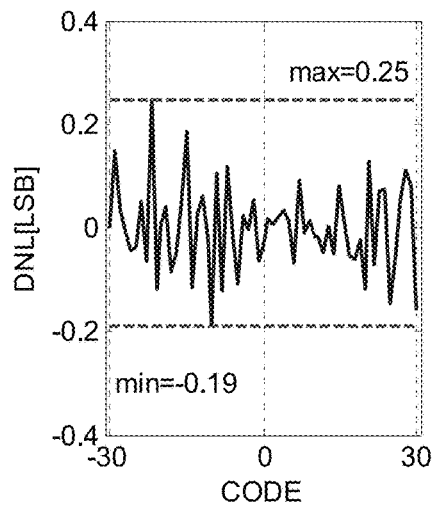
FIGS. 19A and 19B show the measured DNL and INL, respectively, of the prototype.
Figure 19B:
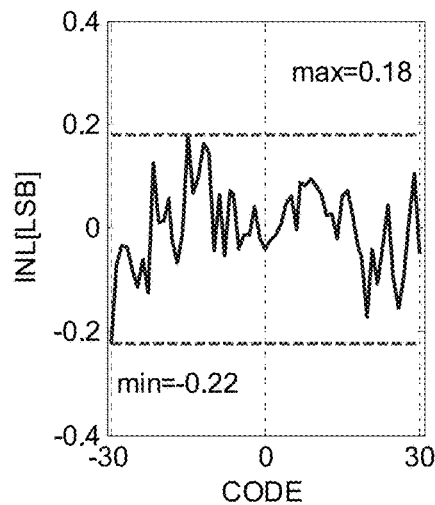

An ADC prototype of the system shown in FIG. 5A was fabricated in a 28 nm 1P10M CMOS process. FIG. 18 shows a chip micrograph of the two-stage ADC. The chip was fabricated with an active area of 0.03 mm$^2$ (250 μm×120 μm). The TI-ADC is directly driven from a 50Ω signal source without any buffer or hierarchical sampler due to the small 16 fF (single-ended) input capacitance. The prototype was clocked at 24 GS/s and the total power consumption was 22.94 mW. From the total power consumption, 12.8 mW was from the ADC array with an 850 mV supply, 9.5 mW was from the clock generation with a 950 mV supply, and 0.64 mW was from the reference ADC. The digital calibration logic was implemented off-chip. The adaptation of the lookup table (LUT) (see e.g., FIG. 4) was performed in the foreground using a sine-fit algorithm.

19A and 19B show the measured differential non-linearity (DNL) and integral non-linearity (INL), respectively, of the prototype. The max. DNL is +0.25/−0.19 LSBs and the max. INL is +0.18/−0.22 LSBs.

Figure 20A:
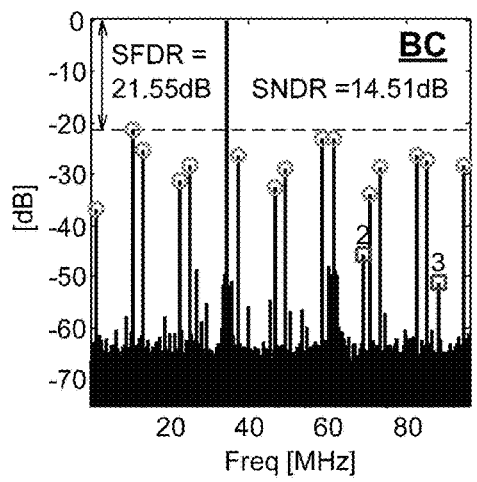
FIGS. 20A and 20B show the ADC output spectra of the prototype before (FIG. 20A) and after (FIG. 20B) skew calibration using an 11.9 GHz sine-wave input.
Figure 20B:
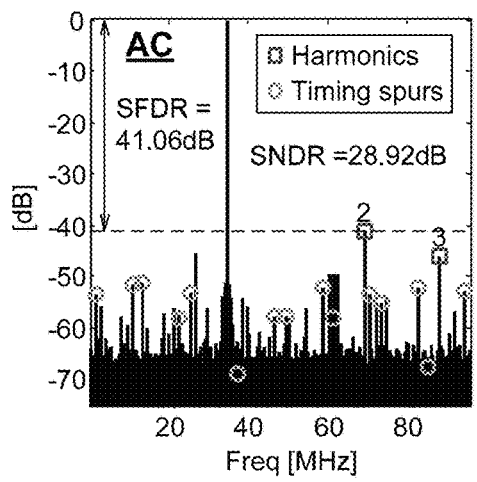

FIGS. 20A and 20B show the ADC output spectra of the prototype before (FIG. 20A) and after (FIG. 20B) skew calibration (at fs=24 GS/s) using an 11.9 GHz sine-wave input. Without calibration, the performance was limited by the TI spurs shown as circles in FIG. 20A. Also shown, the spurious-free dynamic range (SFDR) was 21.6 dB and signal-to-noise and distortion ratio (SNDR) was 14.5 dB without calibration. With skew calibration, as can be seen in FIG. 20B, all skew-related spurs were suppressed to below −50 dBc and the SFDR and SNDR improve to 41.1 dB and 28.9 dB, respectively.

Figure 21:
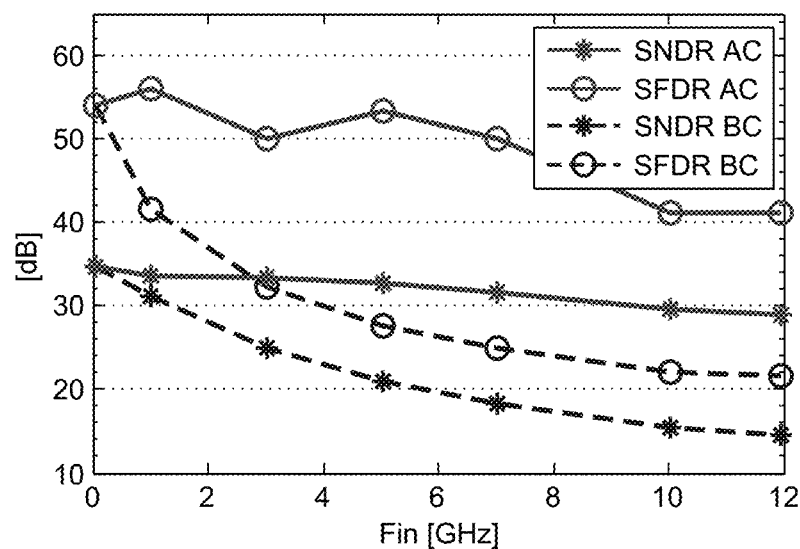
FIG. 21 shows a plot of measured ADC dynamic performance of the prototype for different input frequencies.

FIG. 21 shows a plot of measured ADC dynamic performance of the prototype for different input frequencies. Before calibration, the array performance was limited by the skew starting from a 1 GHz input frequency. After calibration, the SFDR remained above 50 dB from DC to 7 GHz. For higher input frequencies, the SFDR was limited by the $2^{nd}$-order harmonic distortion (HD2) and the SNDR was mainly limited by the jitter from the clock sources.

Figures 22A, 22B:
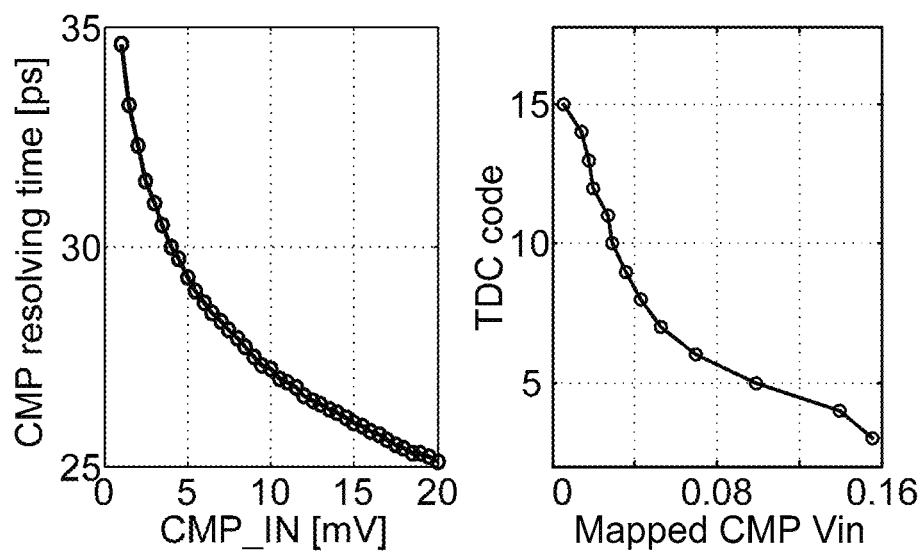
FIGS. 22A and 22B show the learned look-up table (LUT) content compared to the simulated voltage-to-time transfer curves.

FIGS. 22A and 22B show the learned LUT content compared to the simulated voltage-to-time transfer curves; FIG. 22A shows a plot of the simulated voltage-to-time transfer curve; and FIG. 22B shows the measured LUT content As shown, the measured LUT content graph closely matches the simulated voltage-to-time transfer curve. The discrepancies between the two curves are mainly attributed to the PVT variations and the random mismatches among the TDC delay cells.

It should be understood that the examples and embodiments described herein are for illustrative purposes only and that various modifications or changes in light thereof will be suggested to persons skilled in the art and are to be included within the purview of this application.

What is claimed is:

1. A two-stage successive-approximation-register (SAR) analog-to-digital converter (ADC) comprising:
   a first stage comprising a SAR ADC, wherein the SAR ADC comprises a comparator;
   a voltage-to-time interface that translates a voltage-domain residue from the SAR ADC to a time-domain residue, wherein the voltage-to-time interface comprises the comparator, the SAR ADC sharing the comparator with the voltage-to-time interface; and
   a second stage comprising a time-to-digital converter (TDC) that resolves multiple bits from the time-domain residue.

2. The two-stage SAR ADC of claim 1, wherein the second stage digitizes only a last residue of a particular input sample received at the first stage.

3. The two-stage SAR ADC of claim 1, wherein the time-domain residue represents a resolving time of the comparator.

4. The two-stage SAR ADC of claim 1, wherein the voltage-to-time interface further comprises an edge extractor (EE) circuit coupled to an output of the comparator, receiving a ready signal that is output from the comparator and a comparator clock signal.

5. The two-stage SAR ADC of claim 4, wherein the second stage receives only a last residue of a particular input sample received at the first stage from an output of the EE circuit.

6. A method of operating a two-stage successive-approximation-register (SAR) analog-to-digital converter (ADC) comprising a first stage comprising a SAR ADC; a voltage-to-time interface that translates a voltage-domain residue from the SAR ADC to a time-domain residue; and a second stage comprising a time-to-digital converter (TDC) that resolves multiple bits from the time-domain residue, the method comprising:
   sampling a first input voltage signal representing a plurality of bits at the first stage using a sampling clock;
   converting to a first set of bits from the plurality of bits using the SAR ADC;
   for a last bit cycle of the SAR ADC for the plurality of bits, translating the voltage-domain residue to the time-domain residue using the voltage-to-time interface; and
   digitizing multiple bits from the time-domain residue using the TDC to output a second set of bits from the plurality of bits, and wherein digitizing multiple bits from the time-domain residue comprises:
   determining a difference between a comparator clock signal and a ready signal output from a comparator of the voltage-to-time interface; and
   quantizing the difference according to a resolution of the TDC; and
   wherein the first set of bits with the second set of bits are combined to form the plurality of bits.

7. The method of claim 6, wherein the voltage-to-time interface comprises a comparator, wherein the time-domain residue represents a resolving time of the comparator.

8. The method of claim 7, wherein the voltage-to-time interface further comprises an edge extractor (EE) circuit coupled to an output of the comparator, the method comprising:
   providing the time-domain residue from the voltage-to-time interface to the TDC for only the last bit cycle of the SAR ADC by using the EE circuit.

9. The method of claim 6, wherein for the last bit cycle of the SAR ADC for the plurality of bits, outputting a comparison outcome of the SAR ADC as a polarity value for the second set of bits.

10. The method of claim 6, wherein the plurality of bits comprises 6 to 14 bits.

11. The method of claim 6, wherein the second set of bits comprises 4 to 8 bits.

* * * * *